United States Patent [19]

Johnson et al.

[11] Patent Number: 4,930,901
[45] Date of Patent: Jun. 5, 1990

[54] METHOD OF AND APPARATUS FOR MODULATING A LASER BEAM

[75] Inventors: Joel C. Johnson, Lake Oswego; Richard S. Harris, Portland, both of Oreg.

[73] Assignee: Electro Scientific Industries, Inc., Portland, Oreg.

[21] Appl. No.: 357,979

[22] Filed: May 26, 1989

Related U.S. Application Data

[63] Continuation of Ser. No. 289,978, Dec. 23, 1988, abandoned.

[51] Int. Cl.⁵ ............................................... H01S 3/10
[52] U.S. Cl. ....................................... 372/26; 372/69; 372/10; 372/25
[58] Field of Search ................. 372/38, 26, 10, 25, 372/13, 69

[56] References Cited

U.S. PATENT DOCUMENTS

| | | | |
|---|---|---|---|
| 4,276,497 | 6/1981 | Burbeck et al. | 315/209 R |
| 4,337,442 | 6/1982 | Mauck | 273/13 |
| 4,439,861 | 3/1984 | Bradford | 372/25 |
| 4,510,606 | 4/1985 | Yagi et al. | 372/25 |
| 4,539,685 | 9/1985 | Hart et al. | 372/25 |
| 4,630,275 | 12/1986 | Rapoport | 372/26 |
| 4,675,872 | 6/1987 | Popek et al. | 372/25 |
| 4,737,958 | 4/1988 | Sizer, II | 372/25 |
| 4,761,786 | 8/1988 | Baer | 372/10 |

*Primary Examiner*—Léon Scott, Jr.
*Attorney, Agent, or Firm*—Stoel Rives Boley Jones & Grey

[57] ABSTRACT

A laser system operable in both a lead bonding mode and a lead severing mode. When in the lead bonding mode, the light-amplifying medium (38) of the laser is optically pumped by a lamp (45) to produce laser pulses within the laser cavity (36). The power supply (56) is rapidly switched to provide the bonding pulses ($L_b$) at a high repetition rate. A Q-switch (46) is disposed within the cavity (36) to shape the laser output pulses ($L_b$) with a leading power spike ($S_b$) that is suitable for reducing the reflectivity of the lead (20) surface, thereby facilitating maximum absorption of the laser energy for the bonding operation. When in the severing mode, the light-amplifying medium (38) is continuously pumped and the Q-switch (46) is repetitively switched at a rate high enough to generate laser pulses ($L_s$) suitable for severing the leads (20) without heating adjacent portions of the leads (20).

17 Claims, 2 Drawing Sheets

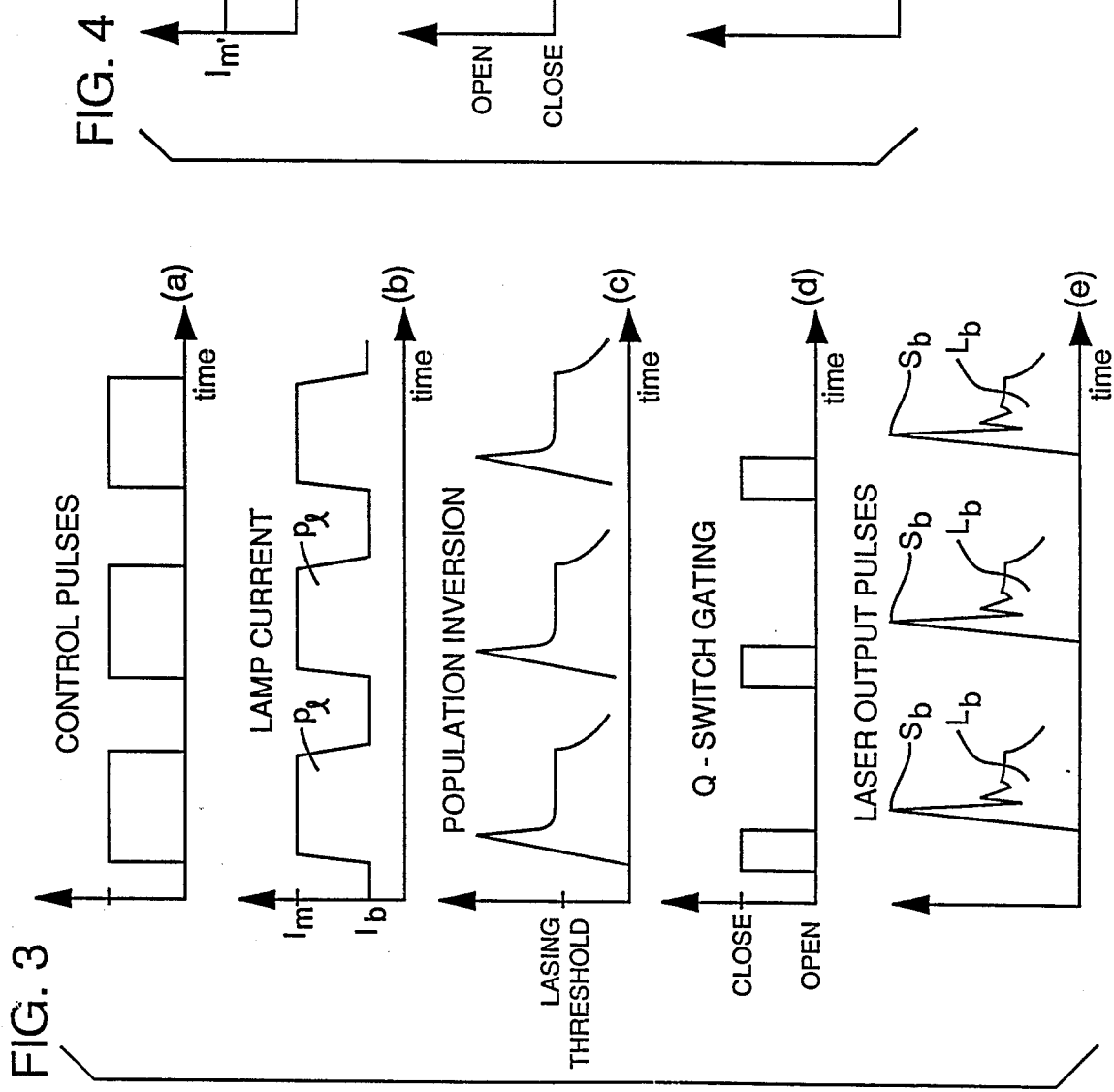

METHOD OF AND APPARATUS FOR MODULATING A LASER BEAM

This is a continuation of application Ser. No. 07/289,978, filed Dec. 23, 1988 now abandoned.

TECHNICAL FIELD

This invention relates to techniques for modulating the light output of a laser and, in particular, to a method of and apparatus for modulating the beam of a single laser of a particular type to perform multiple laser processing tasks.

BACKGROUND INFORMATION

Different lasers have heretofore been used to perform different types of tasks. For example, a modern microcircuit fabrication system employs pulsed Nd:YAG lasers to bond electrically conductive leads to electrical circuit contact pads. The pulsed Nd:YAG laser is capable of providing output pulses of between about ten microseconds and ten milliseconds in duration. The output pulse from a pulsed Nd:YAG laser output typically comprises a train of irregularly spaced subpulses of nonuniform shape and nonconstant power with decreasing amplitudes. A laser output pulse train of this type is suitable for bonding leads made of materials, such as tin-plated copper, that readily absorb the laser energy but is unsuitable for bonding leads made of materials, such as gold-plated copper, that reflect laser light.

Upon completion of a bonding operation, the microcircuit fabrication system employs a cutting mechanism, such as a reciprocating blade mechanism, to sever the leads from a lead frame to which the leads are attached.

A resistor trimming system uses a continuously pumped Q-switched Nd:YAG laser that creates a train of laser pulses to achieve a relatively slow removal of an electrically conductive target material. Each of the successive pulses in the pulse train effectively "nibbles"-through about 10 percent of the target material.

SUMMARY OF THE INVENTION

An object of this invention is, therefore, to provide a method of and apparatus for modulating a beam emitted by a single laser of a particular type to perform multiple laser processing tasks.

Another object of this invention is to provide a microcircuit fabrication system in which such a method can be practiced and which incorporates such an apparatus.

A further object of this invention is to provide such a microcircuit fabrication system that is capable of bonding leads constructed of either a light-reflecting or a light-absorbing material.

Still another object of this invention is to provide a microcircuit fabrication system that employs a single laser system that is capable of bonding and cutting a target material.

This invention provides a method and an apparatus for modulating a single laser to perform multiple laser processing tasks. The invention is described only by way of example with reference to an optically pumped Nd:YAG laser that is incorporated in a microcircuit fabrication system.

The microcircuit fabrication system described herein is a laser-based system for attaching leads to circuit contacts. The system provides laser output light emissions or pulses at a very high repetition rate to bond the leads and contacts and consistently produces high peak power pulses to maximize absorption of the beam energy by the lead.

More particularly, it has been found that leads having reflective surfaces will absorb more laser energy after the lead surface has been roughened. To this end, the system of the present invention produces laser pulses that have energy distributions that define at least one "spike" at the leading edge of each pulse. The spike has a power level sufficient to vaporize (i.e., roughen) the surface of the lead, thereby facilitating absorption of the relatively lower-power remaining portion of the pulse.

The laser pulses of the present invention have a duration sufficient to ensure that the laser energy reaches the lead/pad surface interface. Further, apart from the roughening spike at the leading edge of the pulses, the power of the laser pulses is not so high that the lead material is damaged by excessive vaporization.

The system of the present invention is also adaptable for producing laser pulses for severing the bonded leads from the lead frame, thereby eliminating the need for separate severing mechanisms.

BRIEF DESCRIPTION OF THE DRAWINGS

FIG. 3 is a timing diagram illustrating the production of laser pulses suitable for bonding leads to circuit contact pads.

FIG. 4 is a timing diagram illustrating the production of laser pulses suitable for severing leads from lead frames.

DETAILED DESCRIPTION OF PREFERRED EMBODIMENT

Figure 1:
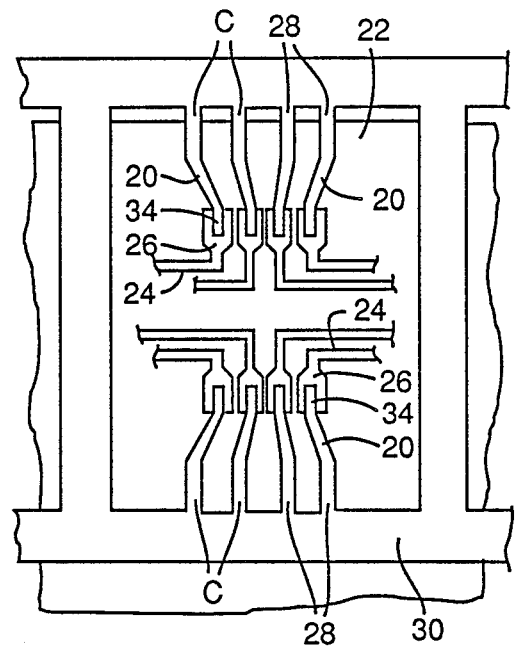
FIG. 1 is a top plan view of a lead frame positioned near a circuit.

FIG. 1 depicts a plurality of leads 20 in position for attachment to a circuit 22. The circuit 22 is shown with conductors 24 that terminate in contact pads 26. The other ends of the conductors 24 connect with various circuit components (not shown).

The leads 20 are photolithographically produced from electro-plated gold or copper foil strips having 0.035 mm thickness. It is understood that although foil leads are hereafter discussed, the present system may be used to bond and sever leads of various types and thicknesses.

Each lead 20 is integrally attached at its outer end 28 to an elongated lead frame 30. Each frame 30 may carry several groups of leads 20. The free end 34 of each lead 20 is arranged to touch a particular contact pad 26 after the circuit 22 and frame 30 are properly registered by known mechanisms. A laser beam is directed to strike the free end 34 of each lead 20 and bond the lead end 34 to its associated contact pad 26.

Figure 2:
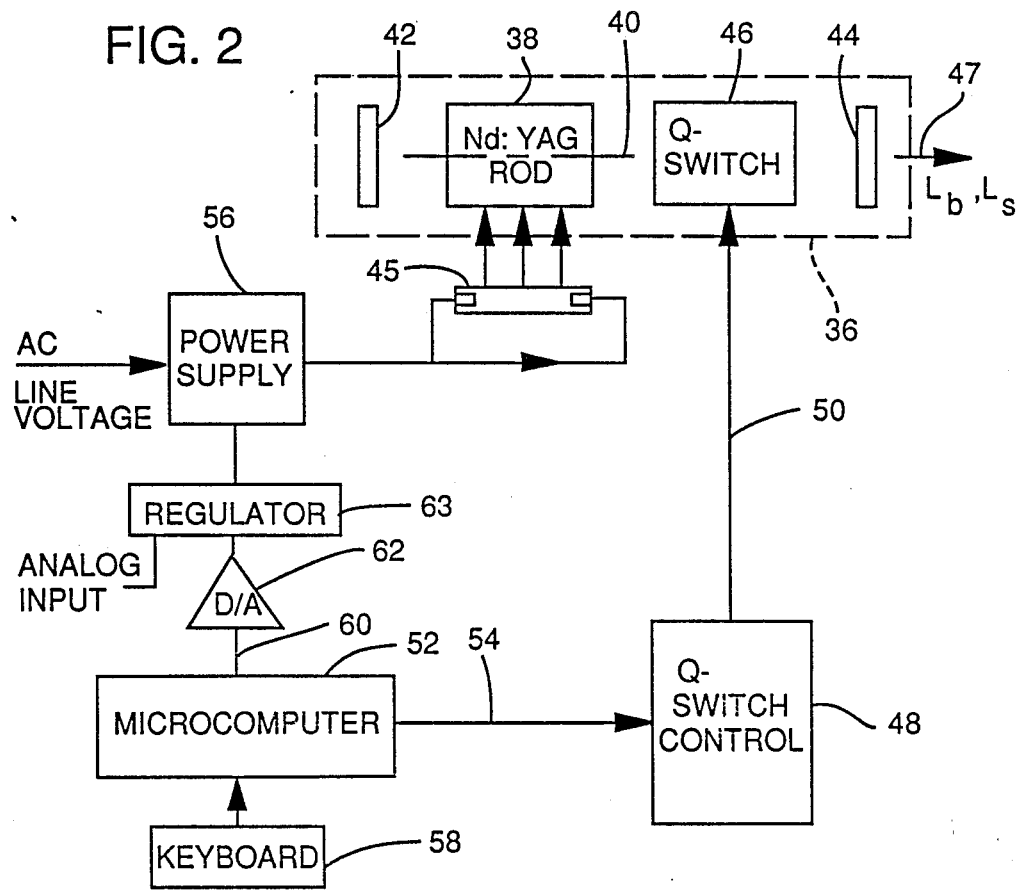
FIG. 2 is a block diagram of a laser system of the present invention.

With reference to FIG. 2, the laser system of the present invention comprises a laser cavity 36 in which is disposed a light-amplifying medium such as an elongated Nd:YAG rod 38 having a longitudinal axis shown at 40. A rear end mirror 42 is positioned at one end of the rod 38. The rear end mirror 42 reflects back through the rod 38 laser light that propagates through the rod along an axis generally parallel to the longitudinal axis 40 of the rod 38. A front end mirror 44 is positioned at the opposite end of the rod 38. The front end mirror 44 is partially transparent. Consequently, a portion of the laser light incident on the mirror 44 exits the cavity 36 and a portion of the laser light is reflected back through the rod 38 toward the rear end mirror 42.

Skilled persons will appreciate that, whenever the rod 38 is optically pumped by means such as a pulsed lamp 45, the excited neodymium ions in the rod 38 and the mirrors 42, 44 cooperate to produce laser pulses within the cavity 36. The laser pulses exit the cavity as coherent laser pulses as indicated by the arrow 47. Alternatively, a continuously pumped rod 38 produces a continuous laser beam that exits the cavity.

The laser described herein is of the Nd:YAG type having an arc lamp pumping source power supply that is switchable between different drive current levels to modulate the laser output light intensity. There is no energy storage device through which a pumping current is discharged to modulate the laser output light intensity.

The output light of such a Nd:YAG laser is characterized by a relatively constant amplitude; whereas, the output light of a conventional pulsed Nd:YAG laser is characterized by relaxation oscillations of generally decreasing amplitudes. Further, the laser pulse repetition rate of conventional pulsed Nd:YAG lasers is usually limited to approximately 200 Hz. This low repetition rate is a consequence of the technique used to drive the flash lamp that pumps the laser. These prior techniques supply current to the lamp via the discharge of capacitors. The repetition rate is limited, therefore, as a function of the time required to recharge the capacitors.

A conventional acoustooptic-type Q-switch 46 is positioned within the laser cavity 36 between the rod 38 and either of the end mirrors 42, 44. The Q-switch 46 acts as a shutter and whenever it is "closed" there is no laser output from the cavity 36. During the time when the Q-switch 46 is closed, the number of excited-state neodymium ions, which energy state is typically quantified as the "population inversion," continues to increase beyond the threshold level necessary for lasing. Accordingly, as the Q-switch 46 is again opened, the stored energy in the cavity 36 is released in a high-power laser pulse.

The Q-switch 46 is driven by a Q-switch control circuit 48. The Q-switch control circuit 48 generates an rf signal which, whenever applied to the Q-switch 46, establishes a diffraction grating therein to diffract light passing through the Q-switch 46 (i.e., the rf signal "closes" the Q-switch). The rf signal is applied to the Q-switch 46 over line 50 and is gated via a suitable gate signal that is generated by a programmable microcomputer 52 and that is applied to the Q-switch control circuit 48 on line 54.

The light-amplifying medium (i.e., rod 38) is optically pumped via the light energy generated by the lamp 45. The lamp 45, such as a krypton arc-type, is driven by a switching mode power supply 56. The power supply 56 is controllable to deliver electrical current for driving the lamp 45 to produce light pulses at a high repetition rate. The same power supply 56 is also operable for driving the lamp to produce continuous light output. As will be clear upon reading this description, the light pulses generate laser pulses in the cavity 36, and the laser pulses are further shaped by the Q-switch 46 into laser pulses for bonding the leads 20 to the contact pads 26. The continuous light generated by the lamp 45 produces a continuous laser beam within the cavity 36 that is repetitively Q-switched to produce laser pulses shaped for severing the leads 20 from the lead frame 30.

Turning first to the operation of the system of the present invention for bonding leads 20 to the pads 26 (i.e., the "bonding mode"), and with reference to FIGS. 2 and 3, the power supply 56 and Q-switch control circuit 48 are controlled by the microcomputer 52 to generate laser output pulses (hereafter referred to as bonding pulses $L_b$) that are characterized by energy distributions that render them particularly effective for bonding the leads 20 to the contact pads 26.

The microcomputer 52 is programmed to receive operator input from a keyboard 58 or other suitable input device to initiate the bonding process once the lead frame 30 and circuit 22 are properly registered. The microcomputer 52 responds to this operator command by providing on line 60 a digital current level signal representing the current $I_m$ (e.g., 10 to 40 amps.) to be applied by the power supply 56 to the lamp 45 for generating the light pulses that pump the Nd:YAG rod 38. A digital-to-analog converter 62 converts the current level signal into an analog signal suitable for setting the output current $I_m$ of the power supply 56.

The switching power supply 56 is comprised of an input rectifier and filter circuitry which converts AC line voltage to DC. The DC is then converted into a pulse-width modulated square wave that is subsequently filtered to produce a variable current DC output. The width of the square wave and hence the value of the DC current is controlled by a regulator 63 which accepts either analog or digital control signals. By using a high carrier frequency, e.g., 20,000 Hz to 40,000 Hz for the square wave, it is possible to change the power supply DC output current between two current levels in a period of a few cycles, e.g., between 0.1 to 0.2 milliseconds.

As one aspect of this invention, the power supply 56 is commanded by an appropriate control signal from microcomputer 52 to produce a continuous current, referred to as a "base current" $I_b$, of between 5 and 10 amperes, which is less than the level required to produce a population inversion sufficient for laser output light emissions to occur. When a laser pulse is desired, the power supply output current is commanded by an appropriate control signal to the regulator circuit 63 to produce an output current sufficient to produce a population inversion and subsequent light emissions at a power level necessary for bonding.

The rate at which laser pulses can be produced is limited only by the rate at which the power supply 56 can be commanded from a low current level to a high current level and back to a low current level.

As noted earlier, the bonding pulses $L_b$ that exit the laser cavity 36 are characterized by a temporal energy distribution that maximizes the amount of energy absorbed by the leads 20. To this end, the microcomputer 52 controls the timing of the opening and closing of the Q-switch 46 relative to the lamp current pulses $P_1$ (FIG. 3, (b)) in a manner that results in a bonding pulse $L_b$ having a temporal energy distribution that defines at least one high-power "spike" $S_b$ on its leading edge.

More particularly, FIG. 3, diagram (a), illustrates the timing diagram of the train of control pulses which are produced by the microcomputer 52 and which are sent to the regulator circuit 63 that controls the switching power supply 56. The leading edge of each control pulse causes the current supplied to the lamp 45 instantaneously to ramp from the base current $I_b$ to the current $I_m$ for generating a pulse of sufficient light energy to pump the neodymium ions in rod 38 to the extent that the population inversion in the rod 38 exceeds that necessary for lasing, i.e., causing light emissions, (see FIG. 3, diagram (c)). Each lamp current pulse $P_1$ is at least 5 microseconds in duration, thereby ensuring that the associated laser bonding pulse $L_b$ be of a sufficient duration for heating the lead through to the lead/contact surface interface.

To "shape" each laser bonding pulse $L_b$ with a high-power spike, the microcomputer 52 delivers a gate signal to the Q-switch control circuit 48 for opening the Q-switch at a point in time very near the leading edge of the lamp current pulse $P_1$. More particularly, as shown in FIG. 3, diagram (d), the Q-switch 46 is closed prior to the initiation of the lamp current pulse $P_1$ that results from the control signal supplied to the power supply regulator circuit 63. The Q-switch is reopened approximately 0.1 millisecond after the initiation of the lamp current pulse $P_1$. Consequently, the leading edge of the resultant laser bonding pulse $L_b$ (FIG. 3, diagram (e)) has a spike $S_b$ having a power (for example, 600 W) that is sufficient to vaporize, hence roughen, the surface of the lead 20, which functions as a target for the bonding pulse $L_b$. The remaining portion of the bonding pulse $L_b$ (which portion has power (for example, 100 W) that is insufficient for vaporizing the lead material) is readily absorbed by the now roughened lead 20.

It is possible to omit the Q-switch 46 and utilize only the laser pulses that would occur if the lamp 45 were driven with current pulses $P_1$ as just described. Such laser pulses may occasionally have leading-edge spikes with power sufficient for roughening the lead surface; however, the power of such laser pulses will vary from pulse to pulse because of variations in the optical fluorescence within the rod from which the pulse develops. Consequently, laser pulses generated as a result of pumping a rod with pulsed light, but not "shaped" with a Q-switch, would fail to consistently have a roughening spike on their leading edges, thereby wasting a portion of the laser energy through reflection.

Some lead material, such as tin-plated copper does not reflect significant amounts of laser light. Accordingly, the necessity for employing a Q-switch to shape the bonding pulse $L_b$ as just described is unnecessary. Nevertheless, in such instances, the rapid laser pulse repetition rate provided by the switching mode power supply of the present invention may be advantageously employed to greatly increase the speed of the bonding operation.

As noted above, the present invention provides a laser system that can be used for both bonding leads to contacts and severing leads from their associated carriers. This description now turns to the lead severing capabilities of the system (i.e., the "severing mode").

After the leads 20 have been bonded to the circuit pads 26, the laser is moved so that its output pulses will strike the leads at a location (C in FIG. 1) away from the contact pad 26. The operator then signals the microcomputer 52, via keyboard 58, that the severing mode is desired. The microcomputer 52 responds by applying an appropriate current level signal on line 60 to change the power supply 56 output to a current $I_m$, (for example, 20 amps.) for continuously driving the arc lamp 45 (see FIG. 4, diagram (a)).

As the lamp 45 continuously pumps the neodymium ions in the rod 38, the microcomputer 52 directs via line 54 a gate signal to the Q-switch control circuit 48, which signal causes the control circuit 48 to repetitively and rapidly (for example, 20 kHz, see FIG. 4, diagram (b)) open and close the Q-switch to generate a succession of high-power laser pulses for vaporizing the lead 20 in severing area C (FIG. 1). That is, each successive laser pulse (hereafter referred to as severing pulses $L_s$) vaporizes a portion of the lead 20 in area C. After a sufficient number of severing pulses $L_s$ impinge upon the lead 20, the lead will be completely severed.

It is noteworthy that the rapid Q-switching that occurs when the system is in the severing mode produces laser pulses $L_s$ (see FIG. 4, diagram (c)) with high power, for example, greater than 10,000 watts, and with very short duration, for example, 100 nanoseconds. Such a short, high-power pulse means that little of the pulse energy will be conducted into portions of the lead that are adjacent to the severing area C (FIG. 1). Consequently, the severing "cut" will be clean, and the adjacent portions of the leads will not be distorted from excessive laser heating.

In view of the above, it can be appreciated that the present invention provides a single laser system having capability for both bonding and severing the leads, without the need for separate laser systems for each operation. Moreover, the present invention can be used in applications other than bonding such as, for example, scribing a glass or other light transmissive surface.

It can also be appreciated that the system of the present invention may be operated with any number of control devices, irrespective of whether such devices are programmable. For example, a conventional waveform generator may be employed to generate signals to the regulator circuit described above. Other substitutions and equivalents will be apparent to one of ordinary skill in the art.

We claim:

1. A laser system for generating laser output light emissions for impingement upon a target, comprising:
   (a) a light-amplifying medium;
   (b) pumping means for pumping the light-amplifying medium With a succession of light pulses to generate laser output light emissions, successive ones of the light pulses separated by a time interval and each light pulse represented in time with a leading edge and a trailing edge;
   (c) a Q-switch cooperating with the light-amplifying medium to provide a first state in which no laser output light emission takes place and a second state in which laser output light emission takes place; and
   (d) Q-switch control means for switching the Q-switch to the first state during the time interval between each light pulse and for switching the Q-switch so that it is in the second state for at least a point in time proximal to the leading edge, and between the leading edge and the trailing edge of each light pulse, thereby to provide a laser system that produces laser output light emissions characterized by temporal energy distributions in which there is a higher energy level near the leading edges of the light pulses and a lower energy level near the trailing edges of the light pulses.

2. The system of claim 1 wherein the pumping means includes a switching power supply for generating the light pulses at a predetermined frequency.

3. The system of claim 2 wherein the pumping means further includes a lamp in optical association with the light-amplifying medium, and base current means for continuously supplying the lamp with an electrical current.

4. The system of claim 1 wherein the target has a target surface and wherein the pumping means and the Q-switch control means are operable so that the temporal energy distribution of each of the laser output light emissions defines a leading edge power spike of sufficient magnitude for vaporizing a portion of the target surface.

5. The system of claim 1 wherein the Q-switch control means switches the Q-switch from the second state to the first state at point in time just prior to the leading edge of each light pulse.

6. The system of claim 1 wherein the pumping means is also operable for continuously pumping the light-amplifying medium and wherein the Q-switch control means includes severing mode means for repetitively switching the Q-switch between the first and second states so that the resultant laser output light emissions have temporal energy distributions sufficient to sever the target whenever the emitted laser output light impinges upon a target.

7. A method of operating a laser for generating laser output light emissions suitable for bonding together first and second adjacent surfaces, wherein the laser includes a light-amplifying medium associated with a laser cavity, the method comprising the steps of:
  (a) pumping the light-amplifying medium of the laser with a succession of light pulses for generating laser output light emissions;
  (b) positioning a Q-switch within the laser cavity;
  (c) closing the Q-switch between the light pulses and opening the Q-switch during the light pulses so that there propagate from the cavity laser output light emissions having temporal energy distributions such that whenever emitted laser output light impinges upon a target that includes the first surface, the first and second adjacent surfaces will be bonded together.

8. The method of claim 7 wherein the target is characterized by relatively low light energy absorption properties and wherein the Q-switch is opened at a point in time near the beginning of each light pulse so that each laser output light emission has a temporal energy distribution defining a leading power spike for increasing the light energy absorption properties of the target.

9. The method of claim 8 wherein the pumping step includes switching between first and second current levels at a predetermined rate in response to the output current of a power supply that is connected to a lamp optically associated with the light-amplifying medium.

10. The method of claim 9 further including the step of supplying a continuous base current to the lamp during the time the power supply output current is being switched between the first and second current levels.

11. The method of claim 7 further including the step of severing the target after the first and second adjacent surfaces are bonded together, the step of severing comprising the substeps of:
  (a) continuously pumping with a light source the light-amplifying medium of the laser; and
  (b) repetitively opening and closing the Q-switch so that the laser output light emissions have temporal energy distributions sufficient to sever the target whenever the emitted laser output light impinges upon a target.

12. A laser system for generating laser output light emissions suitable for bonding together a target material having a first surface positioned adjacent a second surface, comprising:
  (a) a light-amplifying medium;
  (b) pumping means operable upon receipt of electrical current at a first level for pumping the light-amplifying medium to generate a laser output light emission; and
  (c) pumping control means associated with the pumping means for delivering electrical current to the pumping means, the pumping control means being switchable between a first current level and a second current level whose absolute value is lower than that of the first current level, and the pumping control means being switchable between the first and second current levels at a rate limited by the transition times required for the current to change between the first level and the second level, the laser output light emission generated by the pumping means in conjunction with the pumping control means having a temporal energy distribution such that, whenever the emitted laser output light impinges upon a target material having a first surface that is positioned adjacent to a second surface, the first and second surfaces are bonded together.

13. The system of claim 12 wherein each light pulse generated by the pumping means is represented in time with a leading edge and a trailing edge, the system further including:
  (a) a Q-switch cooperating with the light-amplifying medium to provide a first state in which no laser output light emission takes place and to a second state in which laser light output emission takes place; and
  (b) Q-switch control means for switching the Q-switch to the first state during the time interval between each light pulse and for switching the Q-switch so that it is in the second state for at least a point in time proximal to the leading edge and between the leading edge and trailing edge of the light pulse.

14. The system of claim 13 wherein the Q-switch control means is operable for switching the Q-switch from the first to the second state at a time relative to the leading edge of each light pulse so that there is produced a corresponding laser output light emission that has a temporal energy distribution that defines a spike portion and an adjacent portion that is contiguous with the spike portion, the spike portion having a peak power level sufficient to vaporize a portion of the target material, the adjacent portion having a power level sufficient to bond together the first and second adjacent surfaces.

15. The system of claim 13 wherein the pumping control means is operable for continuously pumping the light-amplifying medium and wherein the Q-switch control means includes severing mode means for repetitively switching the Q-switch between the first and second states such that the laser output light emissions have temporal energy distributions sufficient to sever the target material whenever the emitted laser output light impinges upon a target material.

16. A method of pumping a laser for generating laser output light emissions suitable for bonding together a target material having a first surface positioned adjacent a second surface, wherein the laser includes a light-amplifying medium optically associated with a light source, the method comprising the steps of:
  (a) connecting a power supply to the light source to deliver current to the light source, the power supply being switchable between a first current level that drives the light source to pump the light-amplifying medium and a second current level whose absolute value is lower than that of the first current level; and (b) switching the power supply between the first and second current levels at a rate limited by the transition times required for the current to change between the first level and the second level, the resultant laser output light emission having a temporal energy distribution sufficient to bond the first surface of the target material to the second surface.

17. The method of claim 16 further including the step of pumping a laser to generate pulses suitable for severing target material after the first surface thereof is bonded to the second surface, the severing step comprising the substeps of:

(a) switching the power supply to the first level; and
(b) repetitively opening and closing a Q-switch operatively associated with the light-amplifying medium so that each laser output light emission has a temporal energy distribution sufficient to sever a target material whenever the emitted laser output light impinges upon the target material.

* * * * *